(12) United States Patent
Alptekin et al.

(10) Patent No.: US 8,946,081 B2
(45) Date of Patent: Feb. 3, 2015

(54) METHOD FOR CLEANING SEMICONDUCTOR SUBSTRATE

(75) Inventors: Emre Alptekin, Wappingers Falls, NY (US); Ahmet Serkan Ozcan, Pleasantville, NY (US); Viraj Yashawant Sardesai, Poughkeepsie, NY (US); Cung Do Tran, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 13/448,497

(22) Filed: Apr. 17, 2012

(65) Prior Publication Data

US 2013/0273737 A1    Oct. 17, 2013

(51) Int. Cl.
| H01L 21/311 | (2006.01) |
| H01L 21/28 | (2006.01) |
| H01L 21/02 | (2006.01) |
| H01L 21/285 | (2006.01) |
| H01L 21/768 | (2006.01) |

(52) U.S. Cl.
CPC .... *H01L 21/02068* (2013.01); *H01L 21/02063* (2013.01); *H01L 21/28518* (2013.01); *H01L 21/76814* (2013.01)
USPC ............ 438/649; 438/723; 438/664; 438/683

(58) Field of Classification Search
CPC ................................................ H01L 21/76889
USPC ....... 438/630, 649, 664, 683, 723, FOR. 360; 257/E21.619
See application file for complete search history.

(56) References Cited

U.S. PATENT DOCUMENTS

| 7,838,428 | B2 | 11/2010 | Chen et al. | |
| 8,187,971 | B2 * | 5/2012 | Russell et al. | 438/659 |
| 8,435,890 | B2 * | 5/2013 | Russell et al. | 438/659 |
| 2005/0272265 | A1 | 12/2005 | Geffken et al. | |
| 2006/0057853 | A1 * | 3/2006 | Mehrotra et al. | 438/706 |
| 2007/0224824 | A1 | 9/2007 | Chen et al. | |
| 2009/0314963 | A1 | 12/2009 | Hautala | |
| 2010/0240185 | A1 * | 9/2010 | Sohn et al. | 438/270 |
| 2011/0272279 | A1 * | 11/2011 | Cheong et al. | 204/298.07 |
| 2011/0272593 | A1 | 11/2011 | Graf et al. | |
| 2013/0230984 | A1 * | 9/2013 | Russell et al. | 438/664 |
| 2013/0270613 | A1 * | 10/2013 | Chou et al. | 257/288 |

FOREIGN PATENT DOCUMENTS

JP         8-283706       10/1996

* cited by examiner

*Primary Examiner* — George Fourson, III
(74) *Attorney, Agent, or Firm* — Yuanmin Cai; L. Jeffrey Kelly

(57) ABSTRACT

Embodiments of the invention include a method of cleaning a semiconductor substrate of a device structure and a method of forming a silicide layer on a semiconductor substrate of a device structure. Embodiments include steps of converting a top portion of the substrate into an oxide layer and removing the oxide layer to expose a contaminant-free surface of the substrate.

18 Claims, 4 Drawing Sheets

METHOD FOR CLEANING SEMICONDUCTOR SUBSTRATE

BACKGROUND

The present invention generally relates to the fabrication of semiconductor devices, and particularly to the cleaning of semiconductor substrate surfaces.

The fabrication of semiconductor devices frequently requires the production of a uniform substrate surface for future processing. Contaminants on the surface of a substrate may undermine device performance by causing defects in device features formed adjacent to the substrate. Removal of these contaminants may therefore lead to increased device performance and reliability. As the features of microelectronic devices are reduced in size and increase in aspect ratio, it may be increasingly difficult to effectively clean some substrate surfaces quickly and without causing damage to the surrounding area. For example, silicide contacts are often formed on substrate surfaces to reduce resistance between the substrate and subsequent layers. Contaminants on the surface of the substrate where silicide is to be formed can cause defects or gaps in the formed silicide layer, increasing resistance and decreasing product yield due to insufficient contact areas. Removing these contaminants before forming the silicide layer can increase uniformity and therefore improve device efficiency and reliability as well as product yield.

BRIEF SUMMARY

The present invention relates to the cleaning of a substrate. One embodiment of the invention may include, first, converting a top portion of the substrate into an oxide layer and, second, removing the oxide layer to expose a contaminant free surface of the substrate.

Another embodiment of the invention may include forming a silicide layer on a substrate. The embodiment may include converting a top portion of the substrate into an oxide layer, removing the oxide layer to expose a contaminant-free surface of the substrate, and forming a silicide layer on the contaminant-free surface of the substrate.

Figure 1A:
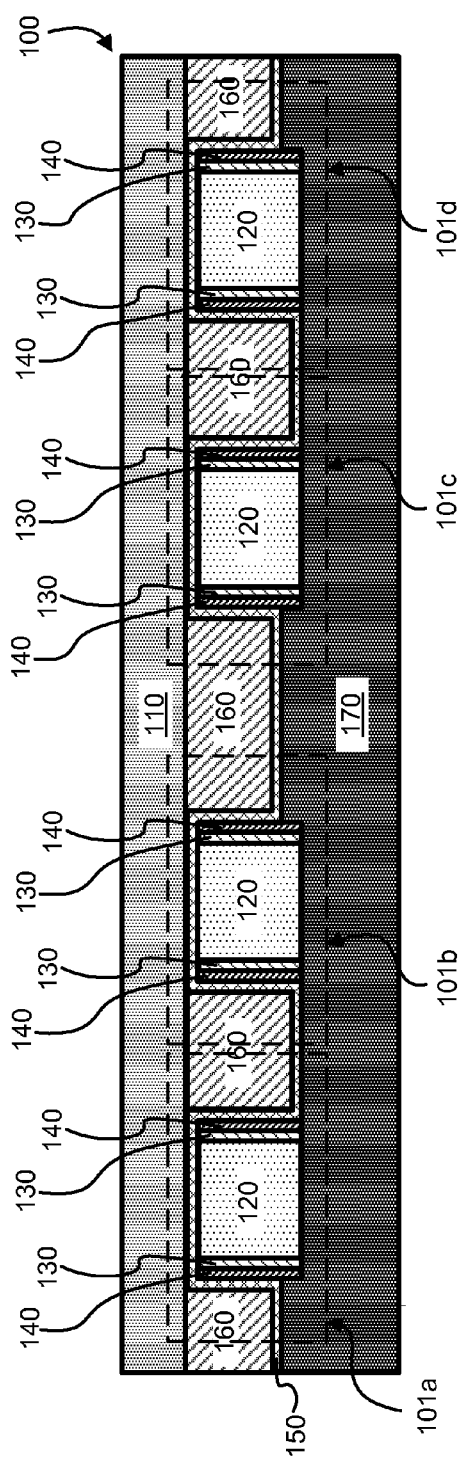
FIG. 1A depicts an exemplary semiconductor structure including transistor devices.

The drawings are not necessarily to scale and are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

FIG. 1A depicts an exemplary semiconductor structure 100 having transistors 101a-101d on a semiconductor substrate 170. In one embodiment, substrate 170 may be made of silicon. In other embodiments, substrate 170 may be made of other materials including, but not limited to, silicon-germanium alloys or silicon-carbon alloys. Each transistor 101 includes a metal gate 120. The metal gate may include a first functional metal layer 130 and a second functional metal layer 140. In one embodiment, first functional metal layer 130 may be made of titanium. The second metal functional layer 140 may be in contact with the first functional metal layer 130 and be made of titanium-aluminum. A stress liner 150 may cover the exposed surface of the substrate 170, the functional metal layers 130, 140, and the metal gates 120. In one embodiment, stress liner 150 may be made of silicon nitride. Interlevel dielectric (ILD) layer 160 fills the regions between the metal gates 120. The top surface of the interlevel dielectric layer 160 and the stress liner 150, if not covered by ILD layer 160, is covered by a hard mask layer 110. The structure and material composition of structure 100, and the mentioned components thereof, is presented for illustrative purposes only and may vary without departing from spirit of the invention.

Figure 1B:
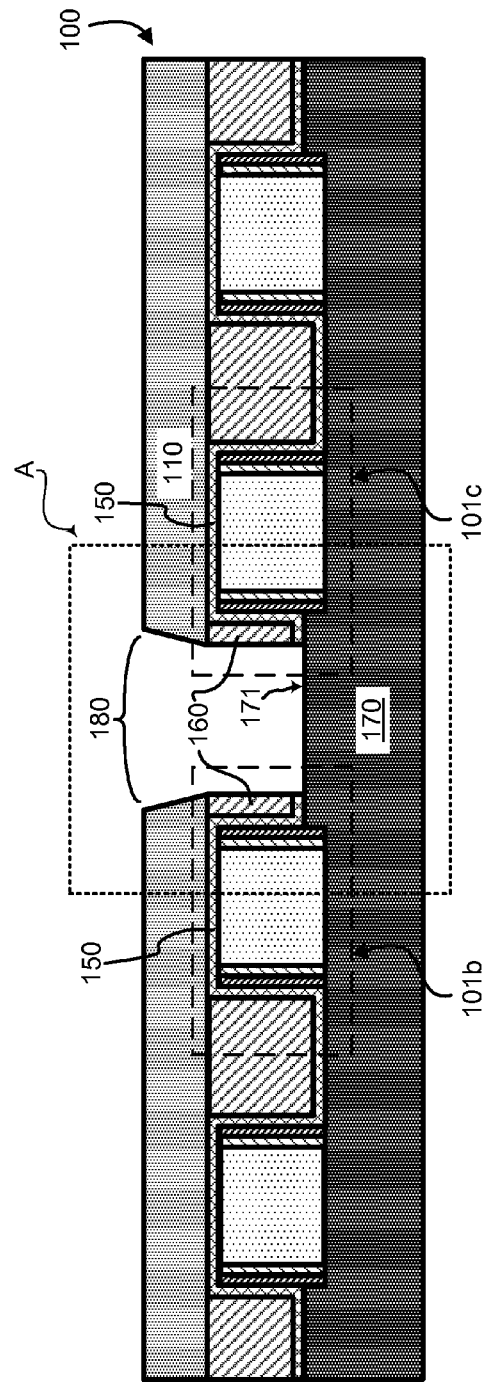
FIG. 1B depicts the exemplary semiconductor structure of FIG. 1A after a trench has been etched in the region between the transistor devices.
Figure 1C:
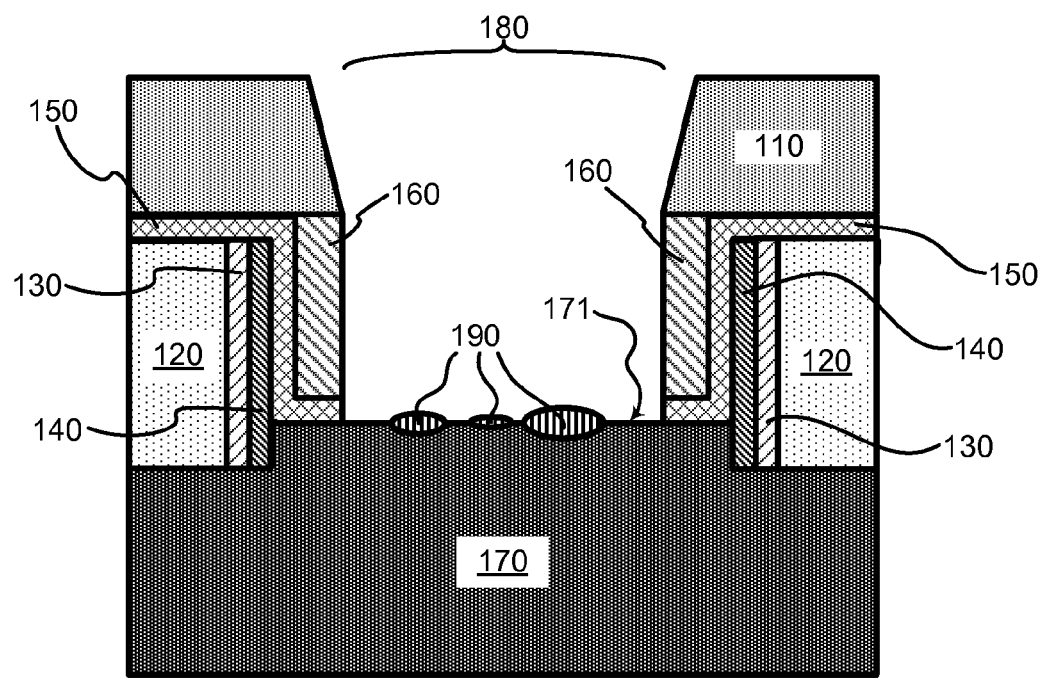
FIG. 1C depicts an expanded view of the trench region of FIG. 1B.

FIG. 1B depicts the exemplary semiconductor structure 100 of FIG. 1A after a trench 180 has been formed in the region, for example, between the transistors 101b and 101c. In one embodiment, trench 180 may be formed or created by patterning and then etching, using a reactive ion etching process, through the hard mask 110, interlevel dielectric layer 160, and stress liner 150 to expose surface 171 of the substrate 170. FIG. 1C depicts an expanded view of region A of FIG. 1B and more clearly illustrates the boundaries of trench 180. In the embodiment of FIG. 1B, trench 180 is bounded on each side by, from top to bottom, hard mask 110, interlevel dielectric layer 160, and stress liner 150 and on the bottom by surface 171 of the substrate 170. During the course of creating trench 180, certain contaminants may remain or exist or be caused to exist at the surface 171 of the substrate 170. For example, contaminants 190 may be present on the surface 171. Contaminants 190 may include, for example, silicon oxide and/or silicon nitride, which may be residue from a reactive ion etching process used to form trench 180.

Figure 2:
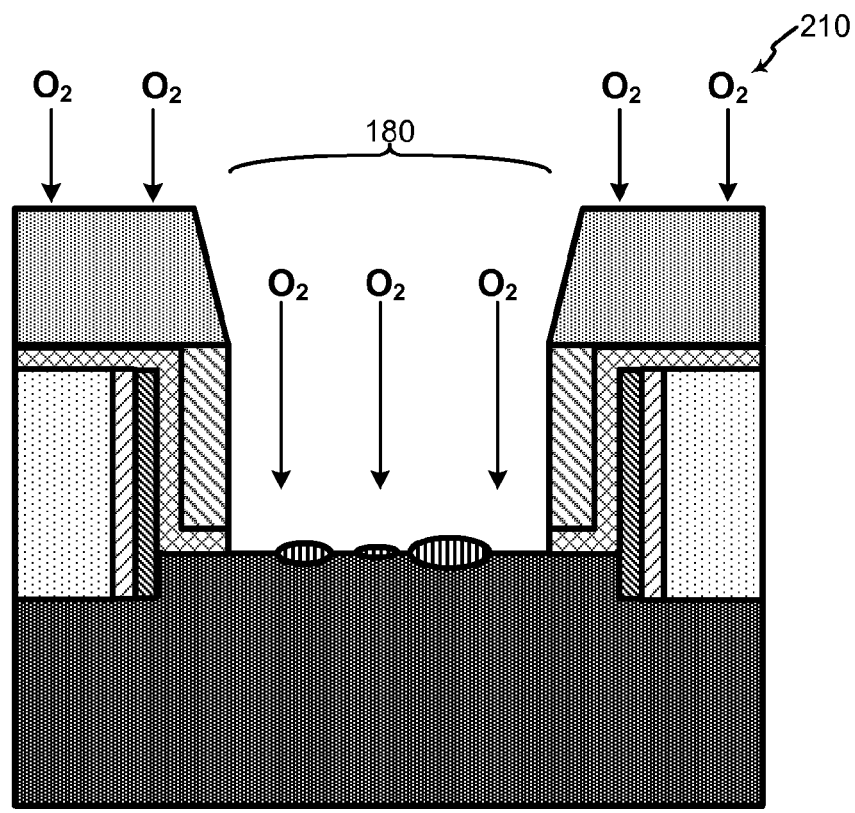
FIG. 2 depicts implanting oxygen in the region depicted in FIG. 1C using a gas cluster ionization beam.
Figure 3:
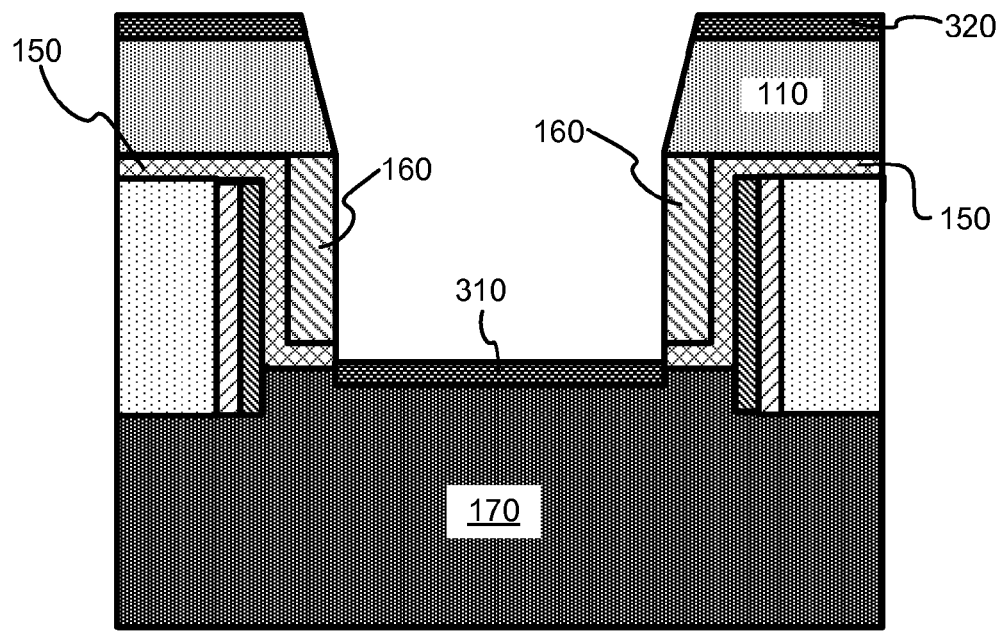
FIG. 3 depicts the oxide layer formed in FIG. 2.

FIGS. 2-6 depict a method for forming a silicide layer in trench 180, according to one embodiment of the invention. As depicted in FIG. 2, oxygen may be implanted in the trench 180 using a gas cluster ion beam (GCIB). The oxygen gas clusters 210 are depicted on FIG. 2 as $O_2$, though the gas clusters may consist of thousands or hundreds of thousands of oxygen atoms depending on conditions. Preferably, the GCIB has an energy range of about 5 to about 10 keV, with a cluster dose of about 1E13 ions/cm$^2$ or higher. This process results in the formation of an oxide layer 310 on substrate 170, as depicted in FIG. 3. Contaminants 190 (shown in FIGS. 1B and 1C) are consumed by oxide layer 310 during its formation. The oxide layer 310 in this embodiment has a thickness in the range of approximately 3-10 nanometers (nm), typically about 5 nm. The actual thickness of the oxide layer 310 may be depending on the quantity and depth of the contaminants 190. During the above-described process, oxygen will also be implanted or deposited in hard mask layer 110, forming oxidized mask layer 320. In embodiments where the hard mask layer 110 is made of silicon nitride, oxidized mask layer 320 may be made of silicon oxynitride. Because the GCIB process is anisotropic, oxygen will only be substantially deposited in surfaces perpendicular to the direction of the beam, having minimal impact on parallel surfaces such as the stress liner 150 and interlayer dielectric 160.

Figure 4:
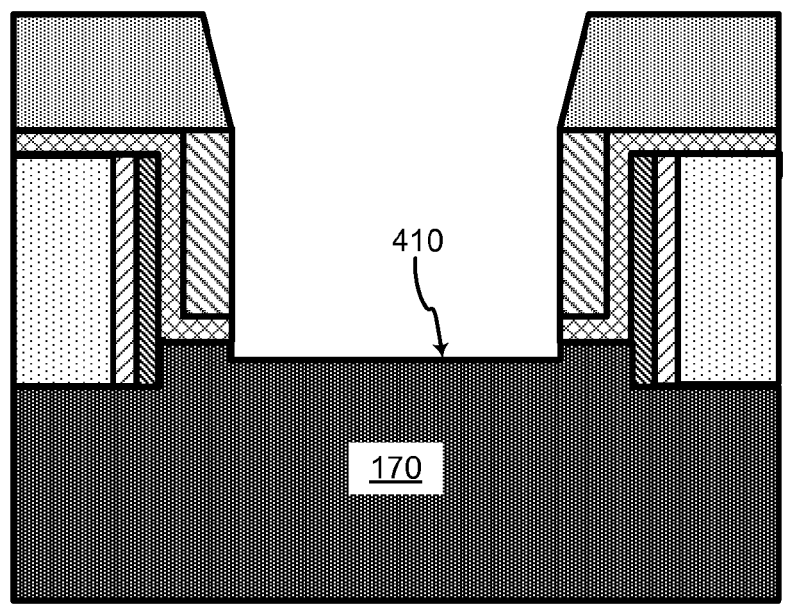
FIG. 4 depicts the exemplary trench region of FIG. 3 after the oxide layer has been removed.

As depicted in FIG. 4, the oxide layer 310 (shown in FIG. 3) is then removed, exposing a uniform surface 410 of the substrate 170. In one embodiment, the oxide layer 310 is removed by an oxide etch process such as a wet chemical (e.g. dilute hydrofluoric acid) or a dry etch process. In the case of applying a dry etching process, the etch is preferably performed in situ, i.e. no break in vacuum such that the etch process may be transferred directly to a subsequent metal deposition process. For example, the in situ Siconi Preclean process from Applied Materials, Inc is desirable because of its selectivity of silicon oxide to other substances including, for example, silicon and silicon nitride. The Siconi oxide etch target needs to be at least as much as the thickness of the oxide layer 310 (shown in FIG. 3) created by the cluster implant process depicted in FIG. 2 (e.g., a minimum of 5 nm etch is used for a cluster implant process that created a silicon oxide layer 310 that is 5 nm thick). As further illustrated in FIG. 4, the etch process may also remove oxidized nitride layer 320 (shown in FIG. 3).

Figure 5:
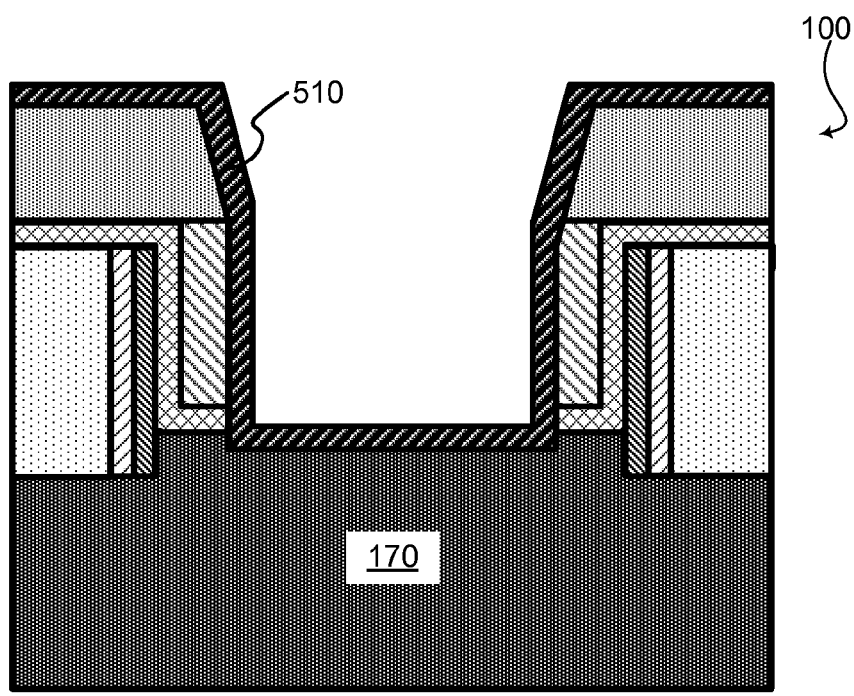
FIG. 5 depicts a nickel layer deposited on the uniform substrate surface of FIG. 4.
Figure 6:
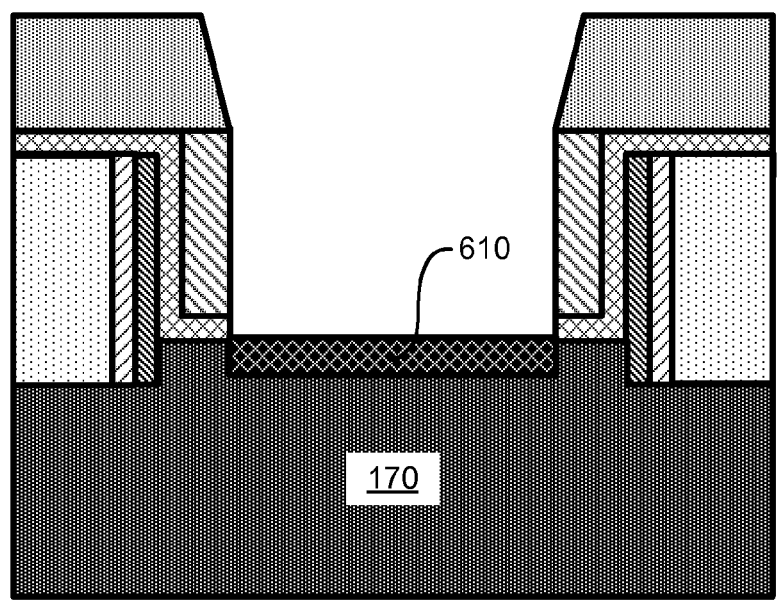
FIG. 6 depicts a silicide layer formed on the uniform substrate surface of FIG. 4.

As depicted in FIGS. 5-6, a silicide layer may then be formed on the uniform surface of the substrate. In FIG. 5, a metal layer 510 is deposited on the top surface of the structure 100. The metal layer 510 may be deposited by any thin film deposition technique available in the industry including, but not limited to, physical vapor deposition (i.e. sputter deposition) or chemical vapor deposition or evaporation. The metal layer 510 may be made of materials including, for example, nickel, platinum, titanium, cobalt or some combination thereof. The structure 100 is then annealed (not shown) to cause reaction of the metal layer 510 with the underlying substrate 170 in order to form a low resistance uniform silicide layer 610 (shown in FIG. 6). The annealing process may typically be performed by a rapid thermal annealing (RTA) process at peak temperatures ranging from about 300 to about 900 degrees Celsius, depending on the silicide material. After removal of any remaining unreacted metal material (not shown), the uniform silicide layer 610 remains directly in contact with substrate 170, as shown in FIG. 6.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of cleaning a semiconductor substrate associated with a device structure, comprising:
    converting a top portion of the semiconductor substrate into an oxide layer comprising implanting oxygen in the top portion of the semiconductor substrate using a gas cluster ion beam; and
    removing all of the oxide layer to expose a contaminate-free surface of the semiconductor substrate.

2. The method of claim 1, wherein the semiconductor substrate comprises a material selected from the group consisting of silicon, silicon-germanium alloy, and silicon-carbon alloy.

3. The method of claim 1, wherein the top portion of the semiconductor substrate has on its surface contaminants.

4. The method of claim 3, wherein the top portion of the semiconductor substrate comprises contaminants such as silicon oxide and silicon nitride.

5. The method of claim 1, wherein the oxide layer is 3-10 nm thick.

6. The method of claim 1, wherein the gas cluster ion beam has an energy range of 5 to 10 keV.

7. The method of claim 1, wherein the gas cluster ion beam has a cluster dose of at least $1 \times 10^{13}$ ions/cm$^2$.

8. The method of claim 1, wherein the oxide layer is removed by a Siconi cleaning process.

9. A method of forming a silicide layer on a semiconductor substrate associated with a device structure, the method comprising:
    converting a top portion of the semiconductor substrate into an oxide layer comprising implanting oxygen in the top portion of the semiconductor substrate using a gas cluster ion beam;
    removing all of the oxide layer to expose a contaminate-free surface of the semiconductor substrate; and
    forming a silicide layer on the contaminant-free surface of the semiconductor substrate.

10. The method of claim 9, wherein the semiconductor substrate comprises a material selected from the group consisting of silicon, silicon-germanium alloy, and silicon-carbon alloy.

11. The method of claim 9, wherein the top portion of the semiconductor substrate has on its surface contaminants.

12. The method of claim 11, wherein the top portion of the semiconductor substrate comprises contaminants such as silicon oxide and silicon nitride.

13. The method of claim 9, wherein the gas cluster ion beam has an energy range of 5 to 10 keV.

14. The method of claim 9, wherein the gas cluster ion beam has a cluster dose of at least $1 \times 10^{13}$ ions/cm$^2$.

15. The method of claim 9, wherein the oxide layer is removed by a Siconi cleaning process.

16. The method of claim 9, wherein the silicide layer is formed by:
    depositing a metal layer on the contaminant-free surface of the semiconductor substrate;
    annealing the device structure; and
    removing any unreacted metal of the metal layer.

17. The method of claim 16, wherein the metal layer comprises a material selected from the group consisting of nickel, platinum, titanium, and cobalt.

18. The method of claim 16, wherein the device structure is annealed by rapid thermal annealing at a peak temperature of 300 to 900 degrees Celsius.

* * * * *